(12) United States Patent
Teng et al.

(10) Patent No.: US 11,380,859 B2
(45) Date of Patent: Jul. 5, 2022

(54) DISPLAY PANEL AND DISPLAY DEVICE

(71) Applicant: WuHan TianMa Micro-electronics CO., LTD., Wuhan (CN)

(72) Inventors: Fei Teng, Wuhan (CN); Xin Dai, Wuhan (CN); Jiang Chen, Wuhan (CN); Qian Xu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 42 days.

(21) Appl. No.: 17/037,338

(22) Filed: Sep. 29, 2020

(65) Prior Publication Data
US 2021/0013432 A1    Jan. 14, 2021

(30) Foreign Application Priority Data
Jul. 15, 2020 (CN) .......................... 202010678665.3

(51) Int. Cl.
*G09G 3/00* (2006.01)
*G09G 3/32* (2016.01)
(Continued)

(52) U.S. Cl.
CPC ......... *H01L 51/0097* (2013.01); *G09G 3/035* (2020.08); *H01L 27/3269* (2013.01);
(Continued)

(58) Field of Classification Search
CPC .......... G09G 3/035; G09G 2310/0281; G09G 2380/02; H01L 51/0097
See application file for complete search history.

(56) References Cited

U.S. PATENT DOCUMENTS 10,431,604 B2 * 10/2019 Cho .................. H01L 27/124
2018/0307270 A1    10/2018 Pantel
(Continued)

FOREIGN PATENT DOCUMENTS

| CN | 206743301 U | 12/2017 |
|---|---|---|
| CN | 109524446 A | 3/2019 |
| CN | 111292620 A | 6/2020 |

OTHER PUBLICATIONS

State Intellectual Property Office of the People's Republic of China, First Office Action, Chinese Application No. 202010678665.3, dated Apr. 1, 2022, 19 pages.

*Primary Examiner* — Kevin M Nguyen
(74) *Attorney, Agent, or Firm* — Christensen O'Connor Johnson Kindness PLLC

(57) ABSTRACT

A display panel and a display device are provided. The display panel includes a main display region, a first bendable region, a second bendable region, and a first hollow region. The first bendable region and the main display region are connected to each other and arranged along a first direction. The first bendable region is capable of being bent away from a light-exiting surface of the display panel through a first bending axis. The second bendable region and the main display region are connected to each other and arranged along a second direction. The second direction intersects the first direction. The second bendable region is capable of being bent away from the light-exiting surface of the display panel through a second bending axis. An intersection point of extension lines of the first bending axis and the second bending axis is located in the first hollow region.

18 Claims, 9 Drawing Sheets

(51) Int. Cl.
   *H01L 51/00* (2006.01)
   *H01L 27/32* (2006.01)
(52) U.S. Cl.
   CPC ....... *G09G 3/32* (2013.01); *G09G 2310/0281* (2013.01); *G09G 2380/02* (2013.01); *H01L 2251/5338* (2013.01)

(56) References Cited

U.S. PATENT DOCUMENTS

2019/0081127 A1* 3/2019 Shim .................... H01L 27/124
2019/0363266 A1* 11/2019 Tanaka .................... H01L 51/56

* cited by examiner

DISPLAY PANEL AND DISPLAY DEVICE

CROSS-REFERENCE TO RELATED APPLICATIONS

The present application claims priority to Chinese Patent Application No. 202010678665.3, filed on Jul. 15, 2020, the content of which is incorporated herein by reference in its entirety.

TECHNICAL FIELD

The present disclosure relates to the field of display technologies and, in particular, to a display panel and a display device.

BACKGROUND

With the development of the display technologies, a screen-to-body ratio has gradually become an important indicator for evaluating display panels. The screen-to-body ratio refers to a ratio of a display region of the display panel to a total area of a screen. A relatively high screen-to-body ratio can make appearance of the display panel more beautiful and provide a better viewing experience to users.

The display panel usually includes a display region and a non-display region surrounding the display region. Peripheral circuits will be provided in the non-display region to control pixel units located in the display region to display. Since an area where the peripheral circuits are located cannot be used for display, the screen-to-body ratio of the display panel cannot be easily increased. Increasing the screen-to-body ratio of the display panel has become a research focus of researchers in this field.

SUMMARY

In one aspect, an embodiment of the present disclosure provides a display panel, and the display panel includes a main display region, a first bendable region, a second bendable region, and a first hollow region. The first bendable region and the main display region are connected to each other and arranged along a first direction, and the first bendable region is capable of being bent away from a light-exiting surface of the display panel through a first bending axis. The second bendable region and the main display region are connected to each other and arranged along a second direction, the second direction intersects the first direction, and the second bendable region is capable of being bent away from the light-exiting surface of the display panel through a second bending axis. An intersection point of extension lines of the first bending axis and the second bending axis are located in the first hollow region.

In another aspect, an embodiment of the present disclosure provides a display device including the above display panel. The display panel includes a main display region, a first bendable region, a second bendable region, and a first hollow region. The first bendable region and the main display region are connected to each other and arranged along a first direction, and the first bendable region is capable of being bent away from a light-exiting surface of the display panel through a first bending axis. The second bendable region and the main display region are connected to each other and arranged along a second direction, the second direction intersects the first direction, and the second bendable region is capable of being bent away from the light-exiting surface of the display panel through a second bending axis. An intersection point of extension lines of the first bending axis and the second bending axis are located in the first hollow region.

BRIEF DESCRIPTION OF DRAWINGS

In order to more clearly illustrate technical solutions of embodiments of the present disclosure, the accompanying drawings required to be used in the embodiments are briefly described below. The drawings described below are merely some embodiments of the present disclosure. For those of ordinary skill in the art, other drawings can be obtained from these drawings.

DESCRIPTION OF EMBODIMENTS

In order to better understand technical solutions of the present disclosure, the embodiments of the present disclosure are described in detail with reference to the drawings.

It should be clear that the described embodiment is only some embodiments of the present disclosure, not all embodiments. Based on the embodiment of the present disclosure, all other embodiments obtained by those of ordinary skill in the art shall fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is merely an association describing the associated object, indicating that there can be three relationships. For example, A and/or B can indicate three cases: only A exists; A and B exist concurrently; only B exists. In addition, a character "/" herein generally indicates that the contextual objects are in an "or" relationship.

It should be understood that although the terms first, second, etc. can be used to describe the bendable region in the embodiments of the present disclosure, these bendable regions should not be limited to these terms. These terms are only used to distinguish respective bendable regions from each other. For example, without departing from the scope of the embodiments of the present disclosure, the first bendable region can also be referred to as the second bendable region, and similarly, the second bendable region can also be referred to as the first bendable region.

As mentioned in the Background, due to existence of non-display elements such as peripheral circuits in the display panel, the screen-to-body ratio of the display panel in the related art is relatively small.

In order to increase the screen-to-body ratio of the display panel, a hyperboloid design is usually adopted, that is, a part of the display panel close to left and right frames or upper and lower frames is designed as a curved surface having a certain curvature. Such configuration can make the left and right frames or the upper and lower frames in the display panel provided with the peripheral circuits be bent to a position that is not in the same plane of a front display surface. Therefore, when observing a display image on the front display surface, it is difficult for human eyes to observe existence of the left and right frames or the upper and lower frames. Although this design can broaden a display range to a certain extent, it is still impossible to design the screen-to-body ratio of the display panel to be sufficiently large.

Figure 1:
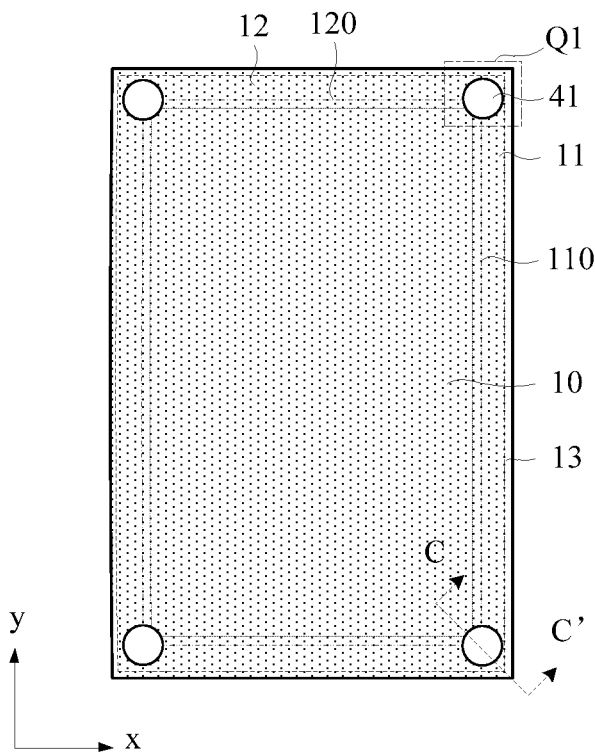
FIG. 1 is a schematic diagram of a display panel in an unfolded state according to an embodiment of the present disclosure.
Figure 2:
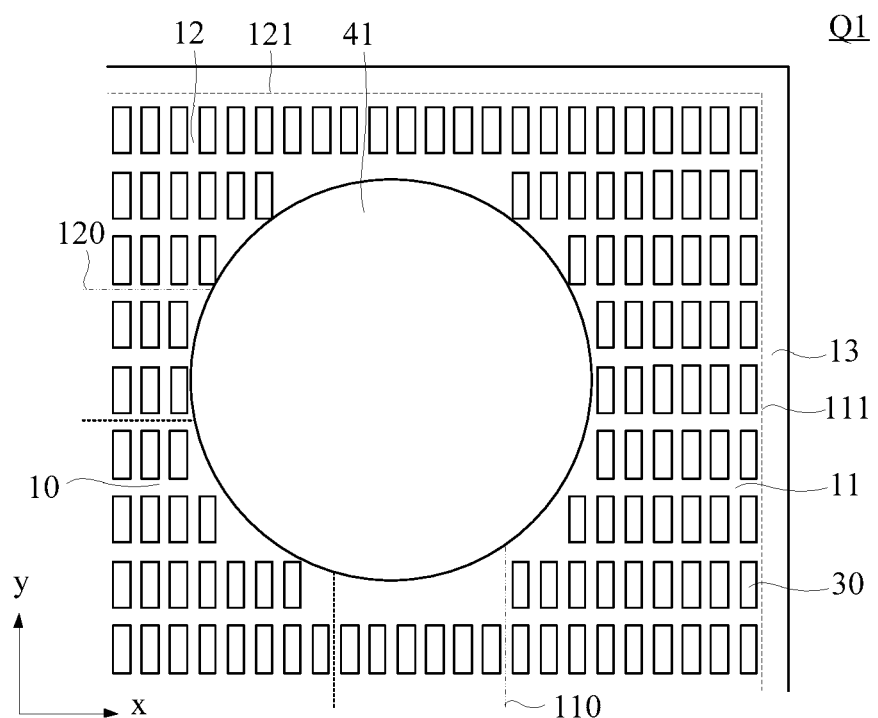
FIG. 2 is an enlarged schematic diagram of an area Q1 in FIG. 1.
Figure 3:
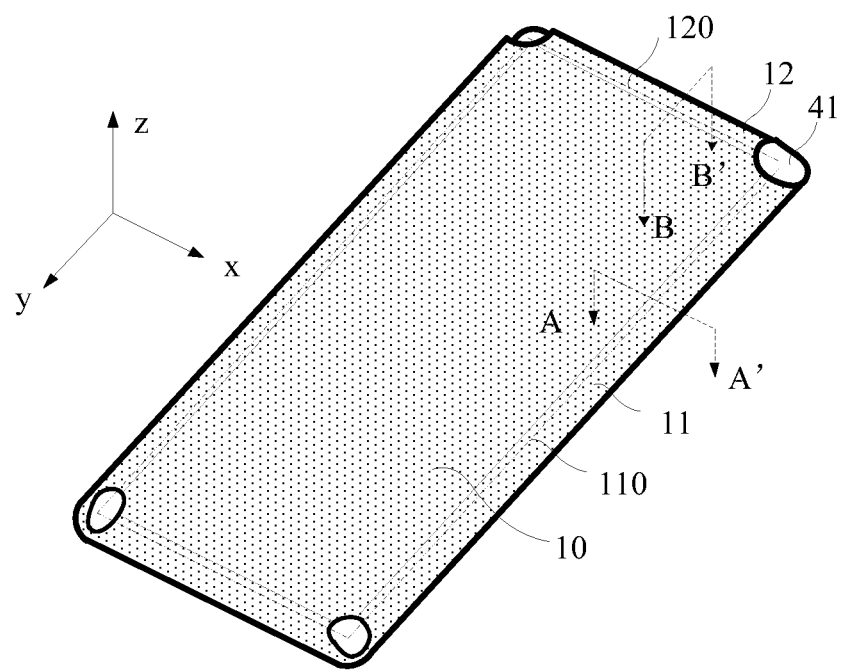
FIG. 3 is a perspective schematic diagram of the display panel shown in FIG. 1 in a bent state.
Figure 4:
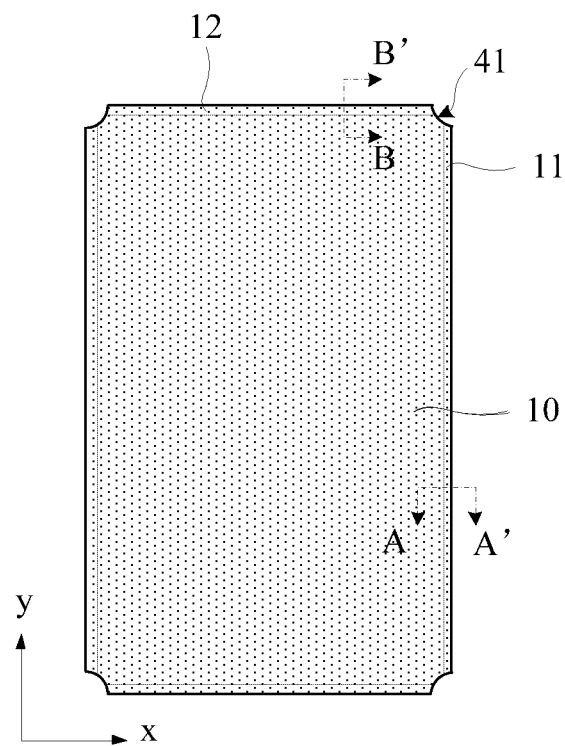
FIG. 4 is a top view of the display panel shown in FIG. 3.
Figure 5:
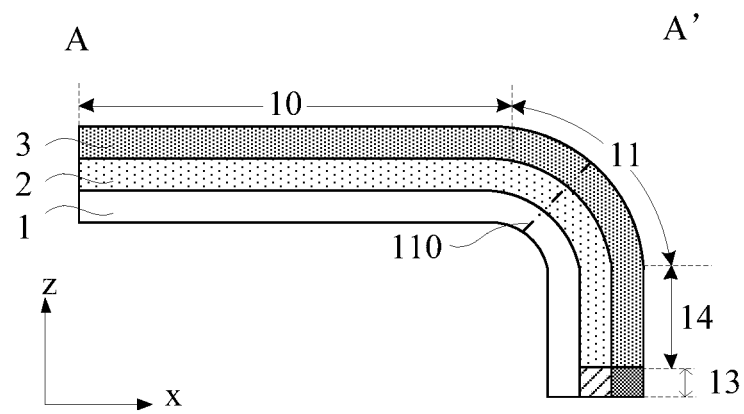
FIG. 5 is a schematic cross-sectional diagram taken along AA' shown in FIG. 4.
Figure 6:
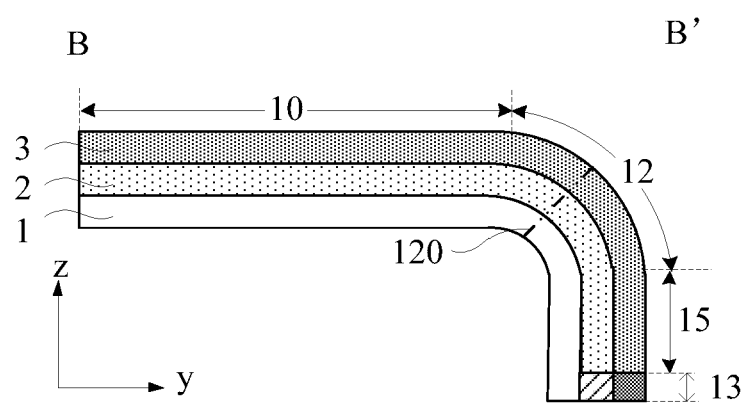
FIG. 6 is a schematic cross-sectional diagram taken along BB' shown in FIG. 4.

Based on this, an embodiment of the present disclosure provides a display panel, as shown in FIG. 1, FIG. 2, FIG. 3, FIG. 4, FIG. 5 and FIG. 6. FIG. 1 is a schematic diagram of a display panel in an unfolded state according to an embodiment of the present disclosure, FIG. 2 is an enlarged schematic diagram of an area Q1 in FIG. 1, FIG. 3 is a perspective schematic diagram of the display panel shown in FIG. 1 in a bent state, FIG. 4 is a top diagram of the display panel shown in FIG. 3, FIG. 5 is a schematic cross-sectional diagram along AA' of FIG. 4, and FIG. 6 is a schematic cross-sectional diagram along BB' of FIG. 4. Along a thickness direction of the display panel, the display panel includes a base substrate 1, a driving circuit layer 2 and a display unit layer 3.

In an embodiment of the present disclosure, the base substrate 1 can be made of a material having flexible or bendable characteristics. For example, the material of the base substrate 1 can be ultra-thin glass, metal foil or organic polymer. The ultra-thin glass may be an ultra-thin alkali-free glass. The metal foil may be, for example, stainless steel foil, aluminum foil, copper foil and the like. The organic polymers include polymer materials such as polyimide (PI), polyvinyl alcohol (PVA), polyethylene terephthalate (PET), polymethylmethacrylate (PMMA), polyethersulfone (PES), polyether Imide (PEI), polyethylene naphthalate (PEN), polyethylene terephthalate (PET), polyphenylene sulfide (PPS), polyarylate (PAR), polycarbonate (PC), cellulose acetate propionate (CAP), polyarylate (PAR), and glass fiber reinforced plastic (FRP).

As shown in FIG. 1, the base substrate 1 includes a main display region 10, a first bendable region 11 and a second bendable region 12. The base substrate 1 located in the main display region 10, the base substrate 1 located in the first bendable region 11 and the base substrate 1 located in the second bendable region 12 can be made of a same material or different materials. A shape of the main display region 10 can be a polygon, such as a rectangle. The first bendable region 11 and the second bendable region 12 are respectively connected to two adjacent side borders of the main display region 10. As shown in FIG. 1, the first bendable region 11 and the main display region 10 are arranged along a first direction x. The second bendable region 12 and the main display region 10 are arranged along a second direction y. The second direction y and the first direction x intersect with each other.

The display unit layer 3 is provided therein with pixel units including light-emitting elements, where the light emitting elements emit light of different colors. In an embodiment, the light-emitting element can be an organic light-emitting element or a quantum dot light-emitting element. As shown in FIG. 2, an orthographic projection of at least one of the light-emitting elements 30 on a plane of the base substrate 1 is located in the main display region 10 in such a manner that the main display region 10 can display images. In an embodiment, a larger number of light-emitting elements are arranged in the display unit layer 3. For example, as shown in FIG. 2, an orthographic projection of other light-emitting elements 30 on the plane of the base substrate 1 can be located in the first bendable region 11 and the second bendable region 12 in such a manner that the first bendable region 11 and the second bendable region 12 can also be used for displaying images.

The driving circuit layer 2 is provided therein with a pixel circuit electrically connected to the light-emitting element and configured to control the light-emitting element. The pixel circuit can include electronic devices such as a thin film transistor and a storage capacitor.

In an embodiment of the present disclosure, as shown in FIG. 3 and FIG. 5, the first bendable region 11 can be bent away from a light-exiting surface of the display panel about a first bending axis 110 as an axis. The light-exiting surface of the display panel is a side surface of the base substrate 1 where the display function layer 3 is provided. During a bending process, the first bendable region 11 of the display panel can be bent at different angles about the first bending axis 110 as the axis. In a nonlimiting example, the first bending axis 110 extends along the second direction y.

As shown in FIG. 3 and FIG. 6, the second bendable region 12 of the display panel can be bent, with a second bending axis 120 as an axis, away from the light-exiting surface of the display panel. During a bending process, the second bendable region 12 of the display panel can be bent at different angles with the second bending axis 120 as the axis. In an embodiment, the second bending axis 12 extends along the first direction x.

The number (i.e., the quantity) of the first bendable region 11 and the number of the second bendable region 12 are not limited in embodiments of the present disclosure. For example, when the display panel is a rectangle as shown in FIG. 1, the number of the first bendable region 11 and the number of the second bendable region 12 can be two respectively. Along the first direction x, the two first bendable regions 11 are respectively provided on two opposite sides of the main display region 10. Along the second direction y, the two second bendable regions 12 are respectively provided on two opposite sides of the main display region 10. After bending the first bendable region 11 and the second bendable region 12, a position where the first bendable region 11 and the main display region 10 are connected to each other and a position where the second bendable region 12 and the main display region 10 are connected to each other can be formed with smooth curved structures in such a manner that the main display region 10 is surrounded by multiple curved surfaces.

As shown in FIG. 2, peripheral circuit areas 13 can also be provided on a side of the first bendable region 11 facing away from the main display region 10 and the second bendable region 12 facing away from the main display region 10, respectively. The peripheral circuit area 13 is provided with peripheral circuits (not shown) therein and the peripheral circuit is configured to control a driving circuit to operate. In an embodiment, the peripheral circuits include circuits such as a gate driving circuit and a data driving circuit. In the embodiment of the present disclosure, through providing the first bendable region 11 and the second bendable region 12, after bending the first bendable region 11 and the second bendable region 12, the peripheral circuits located at the side of the first bendable region 11 bendable region facing away from the main display 10 and the second bendable region 12 facing away from the main display 10 can each be bent into a position that is outside of the plane of the main display region 10, in such a manner that when a user is viewing a display image located in the main display region 10, the peripheral circuit area 13 can be prevented from being viewed, that is, the screen-to-body ratio of the display panel can be increased to the greatest extent, thereby greatly improving viewing experience of the user.

On the basis of providing the first bendable region 11 and the second bendable region 12, as shown in FIG. 1 and FIG. 2, an embodiment of the present disclosure further provides a first hollow region 41 in the display panel, and an intersection point of extension lines of the first bending axis 110 and the second bending axis 120 is arranged in the first hollow region 41. With such configuration of an embodiment of the present disclosure, bending stress, caused by bending, at positions of the first bending axis 110 and the second bending axis 120 in the display panel can be released, in such a manner that defects such as cracks, caused by stress concentration, at a position where the two axes overlap can be avoided. On the basis of increasing the screen-to-body ratio of the display panel, bending reliability of the display panel can also be ensured, and normal display of the display panel can be ensured.

In an embodiment, when manufacturing the display panel, when the first bendable region 11, the second bendable region 12, and the main display region 10 can all be used for display, layer structures that play the same role in different areas of the display panel can be formed simultaneously. That is, the driving circuit layers 2 in the first bendable region 11, the second bendable region 12 and the main display region 10 can be formed simultaneously. After preparation of the driving circuit layer 2 is completed, the display function layers 3 can be simultaneously formed in the first bendable region 11, the second bendable region 12 and the main display region 10.

Figure 7:
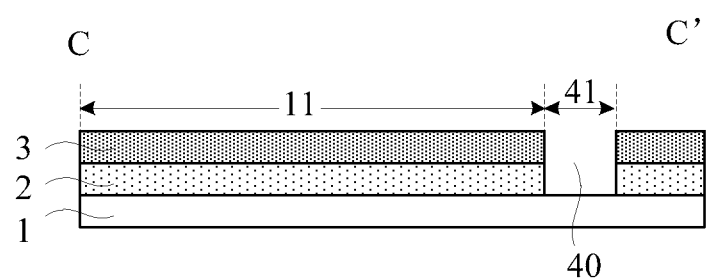
FIG. 7 is a schematic cross-sectional diagram taken along CC' shown in FIG. 1.

FIG. 7 is a schematic cross-sectional diagram taken along CC' shown in FIG. 1. Since the driving circuit layer 2 and the display function layer 3 include inorganic material layers, which are relatively brittle, when designing the first hollow region 41, as shown in FIG. 7, in the embodiment of the present disclosure, a hollow structure 40 located in the first hollow region 41 can be formed in the driving circuit layer 2 and the display function layer 3. In an embodiment, when the driving circuit layer 2 and the display function layer 3 are in the main display region 10, and the first bendable region 11 and the second bendable region 12 are formed by processes such as evaporation, the embodiment of the present disclosure can adopt a mask plate having a specific structure and use the mask plate to shield a position of the first hollow region 41. This process avoids materials from being deposited at the position of the first hollow region 41, so as to form, in the first hollow region 41, a hollow structure 40 without the display function layer 3 and the driving circuit layer 2.

Figure 8:
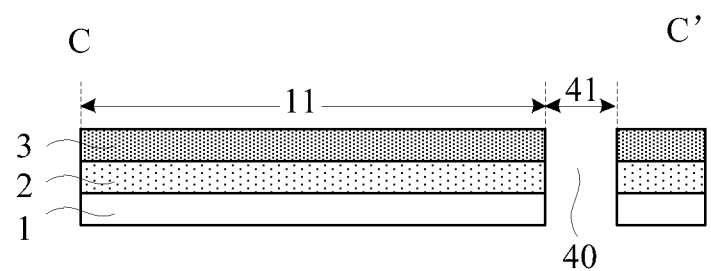
FIG. 8 is a schematic cross-sectional diagram taken along CC' shown in FIG. 1.

FIG. 8 is a schematic cross-sectional diagram taken along CC' shown in FIG. 1. In an embodiment, as shown in FIG. 8, in addition to not forming the display function layer 3 and the driving circuit layer 2 in the first hollow region 41, the base substrate 1 cannot be provided in the first hollow region 41. That is, a depth of the hollow structure 40 shown in FIG. 7 is increased, to make the hollow structure 40 penetrate the base substrate 1, so as to form the structure shown in FIG. 8. In order to form the hollow structure 40 as shown in FIG. 8, after the preparation of respective film layer structures of the display panel are completed, the embodiment of the present disclosure can be cut at the position of the first hollow region 41 in the display panel, to remove the base substrate 1, the driving circuit layer 2 and the display function layer 3 at the position of the first hollow region 41, so as to make the hollow structure 40 penetrate the display panel.

After the formation of the first hollow region 41, as shown in FIG. 2, FIG. 3, FIG. 4 and FIG. 5, in the embodiment of the present disclosure, the first bendable region 11 of the display panel can be bent, with the first bending axis 110 as the axis, away from the light-exiting surface of the display panel. The second bendable region 12 is bent, with the second bending axis 120 as the axis, away from the light-exiting surface of the display panel, in such a manner that the display panel is formed into a structure as shown in FIG. 3. Since no relatively brittle layer is provided at the position of the first hollow region 41, the stress generated during the bending process of the display function layer 3 and/or the driving circuit layer 2 can be released through the first hollow region 41, thereby avoiding defects such as bending cracks and film layer peeling generated in the display function layer 3 and/or the driving circuit layer 2.

In an embodiment, when the light-emitting elements 30 are arranged in the first bendable region 11 and the second bendable region 12 and the display panel is used for display, the area where the main display region 10 is located can be used as a front display region of the display panel, and areas where the first bendable region 11 and the second bendable region 12 are located can be used as side display regions of the display panel. The first bendable region 11, the second bendable region 12 and the main display region 10 can be controlled by a same driving chip, in such a manner that display images displayed in the first bendable region 11 and the second bendable region 12 can form a continuous complete image with a display image of the main display region 10. In an embodiment, the first bendable region 11 and the second bendable region 12 can also be independent display regions. For example, when the display panel is used in a mobile phone or flat panel display, the first bendable region 11 and the second bendable region 12 can be used to display auxiliary information such as remaining battery power, date, time, and prompt information.

In some embodiments, functional modules such as a camera, an earpiece, a sensing device, and key control module can be subsequently installed in the first hollow region 41.

Based on the fact that the first hollow region 41 can cover the intersection point of the first bending axis 110 and the second bending axis 120, in the embodiment of the present disclosure, an area of the first hollow region 41 may be set as large as possible. In an embodiment, as shown in FIG. 1 and FIG. 2, at least a partial area of the first hollow region 41 may be located at a side of the first bending axis 110 or the second bending axis 120 close to the main display region 10. That is, in the embodiment of the present disclosure, the first hollow region 41 can extend and expand, with the intersection point of the first bending axis 110 and the second bending axis 120 as a starting point, a certain distance along the first direction x and the second direction y respectively towards a side close to the main display region 10. With this configuration, an area of the first hollow region 41 can be enlarged, so that the stress generated during the bending process of the display panel is further released, thereby improving the reliability of the display panel.

In an embodiment, the first hollow region 41 can also extend and expand, with the intersection point of the first bending axis 110 and the second bending axis 120 as a starting point, a certain distance along the first direction x and the second direction y respectively towards a side close to the first bendable region 11 and the second bendable region 12, in order to further increase the area of the first hollow region 41. On this basis, as shown in FIG. 3, in the bent state, the first hollow region 41 can be divided into at least two parts. A first partial region close to the main display region 10 can be located in the plane where the main display region 10 of the display panel is located. A second partial region far away from the main display region 10 can be located in the plane of the first bendable region 11 or the plane of the second bendable region 12.

In an embodiment, a shape of a contour of the first hollow region 41 can have various designs. For example, in the unfolded state, the shape of the contour of the first hollow region 41 includes at least one arc in such a manner that the bending stress can be better dispersed in different positions of the first hollow region 41 through the arc, to strengthen (amplify) a release effect of the stress, and to further improve the bending resistance and reliability of the display panel.

In an embodiment, when the first hollow region 41 is provided, as shown in FIG. 1, the embodiment of the present disclosure can make the arc protrude away from a center of the first hollow region 41. With this configuration, in one aspect, the area of the first hollow region 41 can be increased, and the release effect of the stress can be further improved. In another aspect, when the arc is provided to protrude away from the center of the first hollow region 41, a sharp inflection point will be formed between two adjacent arcs, and a stress concentration point will be formed at the inflection point when bending. By providing the arc of the contour of the first hollow region 41 to protrude away from the center of the first hollow region 41, the embodiments of the present disclosure can reduce positions where stress concentration occurs, therefore further improving reliability of the display panel after being bent.

Illustratively, in the embodiment of the present disclosure, the contours of the first hollow region 41 can all be provided as arcs. For example, the contour of the first hollow region 41 can be provided to be a circle or an ellipse. As shown in FIG. 1, the contour of the first hollow region 41 is a circle.

Figure 9:
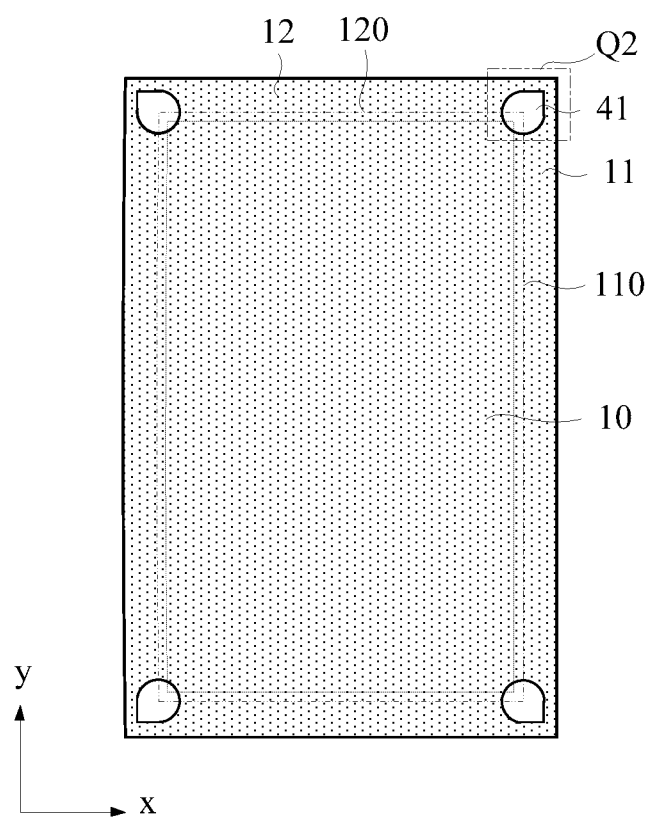
FIG. 9 is a schematic diagram of a display panel in an unfolded state according to an embodiment of the present disclosure.
Figure 10:
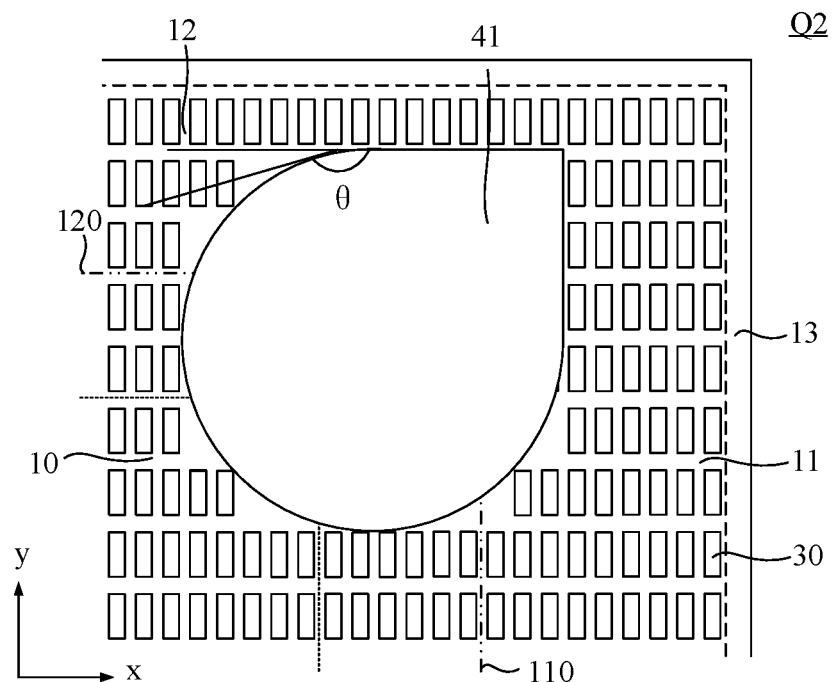
FIG. 10 is an enlarged schematic diagram of an area Q2 in FIG. 9.

In an embodiment, as shown in FIG. 9 and FIG. 10, FIG. 9 is a schematic diagram of another display panel in an unfolded state according to an embodiment of the present disclosure, and FIG. 10 is an enlarged schematic diagram of an area Q2 in FIG. 9. In an embodiment of the present disclosure, the contour of the first hollow region 41 can also be designed as a combination of an arc and a straight line. When the light-emitting element 30 is arranged in the display panel, the straight line of the contour of the first hollow region 41 enables the light-emitting element 30 close to the straight-line contour to be arranged along an extension direction of the linear contour. In comparison with the case where the contour of the first hollow region 41 is provided as an arc, such configuration can reduce a difficulty of providing the light-emitting element 30, and also can eliminate an aliasing problem that occurs during displaying an image.

In an embodiment of the present disclosure, as shown in FIG. 9 and FIG. 10, the shape of the contour of the first hollow region 41 can be designed to include two straight line segments, namely, a first straight line segment and a second straight line segment respectively. One endpoint of the first straight line segment is connected to one endpoint of the second straight line segment, and the other two endpoints of the two straight line segments are respectively connected to two endpoints of the arc. With such configuration, on the basis of reducing the difficulty of providing the light-emitting element 30, eliminating the aliasing problem, and improving the stress release ability, the illustrated embodiments can make the area of the first hollow region 41 as large as possible, which can play a more active role in releasing the bending stress of the display panel.

In an embodiment, an angle θ of the arc contour of the first hollow region 41 satisfies: 0°<θ≤270°, and such configuration may both improves the display screen and release of the bending stress. As shown in FIG. 9 and FIG. 10, the case where the angle θ of the arc contour of the first hollow region 41 is 270° is taken as an example.

In an embodiment, when designing the display panel, as shown in FIG. 1, FIG. 2, FIG. 3, FIG. 4, FIG. 9 and FIG. 10, in an embodiment of the present disclosure, an orthographic projection of the arc of the contour of the first hollow region 41 on the plane of the display panel overlaps a part of an border of the main display region 10.

As shown in FIG. 2 and FIG. 10, the border of the main display region 10 refers to a boundary defined by the light-emitting elements 30 disposed on the outermost side of the main display region 10. The orthographic projection of the arc contour of the first hollow region 41 on the plane of the display panel coinciding with a part of the border of the main display region 10 refers to that arrangement of some light-emitting elements 30 disposed close to the first hollow region 41 in the main display region 10 exhibits an arc shape that is the same as the arc shape of the first hollow region 41 on a macroscopic level. That is, the arc contour of the first hollow region 41 also serves as a partial contour of the main display region 10, and the arc contour is a boundary between the first hollow region 41 and the main display region 10. As shown in FIG. 2 and FIG. 10, the arrangement of these light-emitting elements 30 disposed close to the first hollow region 41 in the main display region 10 can exhibit a sawtooth shape as shown in FIG. 2 and FIG. 10 on a microscopic level. With such configuration, the embodiment of the present disclosure can increase the area of the first hollow region 41, and because the first hollow region 41 covers the intersection point of the extension lines of the first bending axis 110 and the second bending axis 120, the area of the first hollow region 41 can be set as large as possible, to further release the stress generated during the bending process of the display panel and improve the reliability of the display panel.

In the structure in which the contour of the first hollow region 41 is provided to include a straight line as shown in FIG. 9 and FIG. 10, in an embodiment of the present disclosure the contour of the first hollow region 41 can include a straight line that coincides with a part of a border of the first bendable region 11 and/or the second bendable region 12. Since each one of an area of the first bendable region 11 and an area of the second bendable region 12 is smaller than an area of the main display region 10, if display defects such as aliasing appear in the first bendable region 11 and the second bendable region 12, it is easy to notice the defects. With the embodiment of the present disclosure, by configuring the straight line contour of the first hollow region 41 to coincide with a part of the border of the first bendable region 11 and/or the second bendable region 12, the arrangement of the light-emitting elements 30 in the first bendable region 11 and the second bendable region 12 is more regular, which reduces a possibility of the display defects appearing in the first bendable region 11 and the second bendable region 12, thereby improving the display effect of the display panel.

Figure 11:
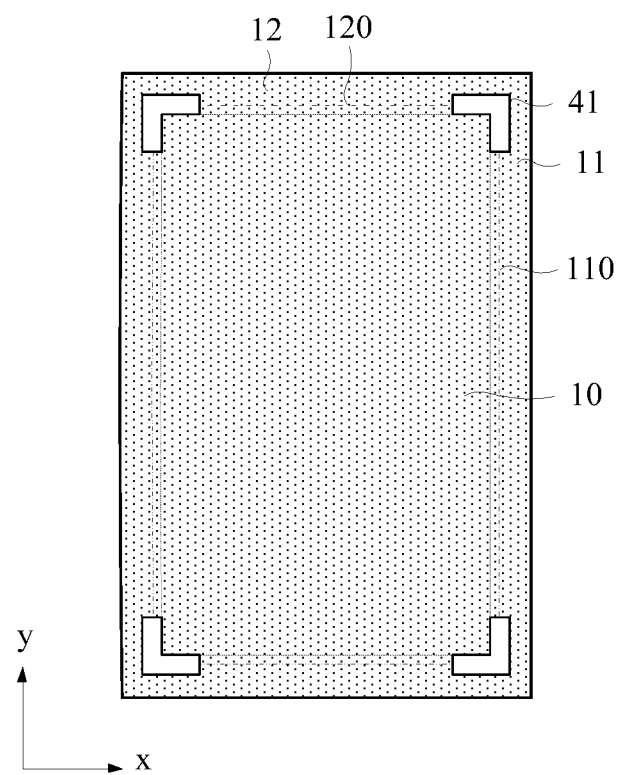
FIG. 11 is a schematic diagram of a display panel in an unfolded state according to an embodiment of the present disclosure.
Figure 12:
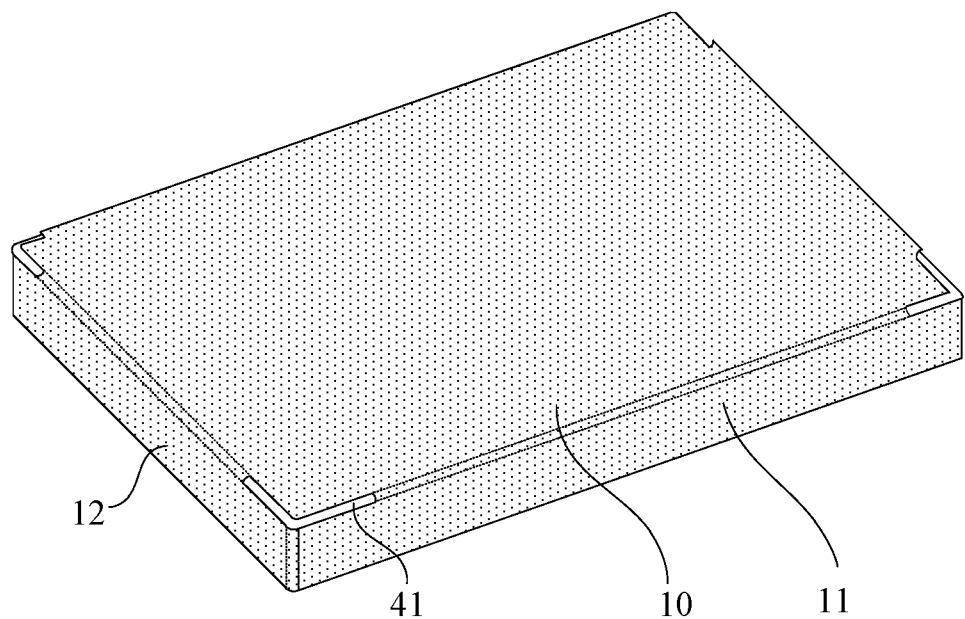
FIG. 12 is a perspective schematic diagram of the display panel shown in FIG. 11 in a bent state.

In an embodiment, the contour of the first hollow region 41 does not include an arc, and the contour of the first hollow region 41 is all designed to be straight lines. As shown in FIG. 11 and FIG. 12, FIG. 11 is a schematic diagram of another display panel in an unfolded state according to an embodiment of the present disclosure, and FIG. 12 is a schematic perspective diagram of the display panel shown in FIG. 11 in a bent state. In the unfolded state, the first hollow region 41 is L-shaped, and the inflection point of the first hollow region 41 covers the intersection point of the extension lines of the first bending axis 110 and the second bending axis 120.

In an embodiment, based on increasing the area of the first hollow region 41, there can be a certain distance between the first hollow region 41 and the closest border of the display panel to the first hollow region 41. That is, the first hollow region 41 is arranged inside the display panel. In an embodiment, the distance can be adjusted according to a dimension of the display panel and dimensions of the first bendable region 11 and the second bendable region 12, which are not limited in the embodiment of the present disclosure.

As shown in FIG. 2, the first bendable region 11 includes a first edge 111 facing away from the main display region 10 and not intersecting with the first bending axis 110. The second bendable region 12 includes a second edge 121 facing away from the main display region 10 and not intersecting with the second bending axis 120. In the unfolded state and the bent state, the first edge 111 and the second edge 121 are connected to each other. That is, on the basis of increasing the area of the first hollow region 41, the embodiments of the present disclosure ensure that the first hollow region 41 is located at a side of the first edge 111 close to the main display region 10 and the second edge 121 close to the main display region 10, to further ensure lateral continuity of the display panel during the display process.

In an embodiment of the present disclosure, in the unfolded state, the contour of the first hollow region 41 can be closed, which is as shown in FIG. 1, FIG. 2, FIG. 9, FIG. 10, FIG. 11, and FIG. 12.

Figure 13:
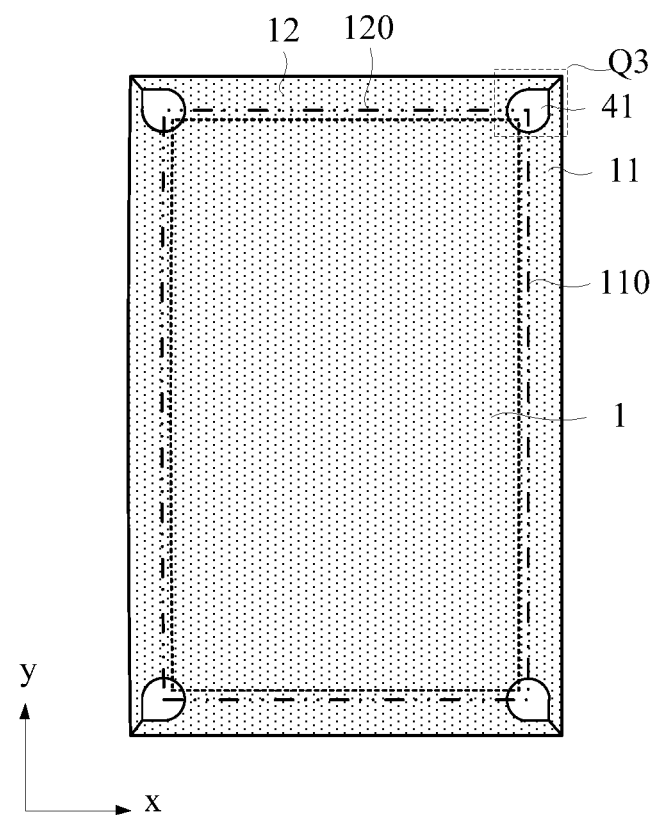
FIG. 13 is a schematic diagram of a display panel in an unfolded state according to an embodiment of the present disclosure.
Figure 14:
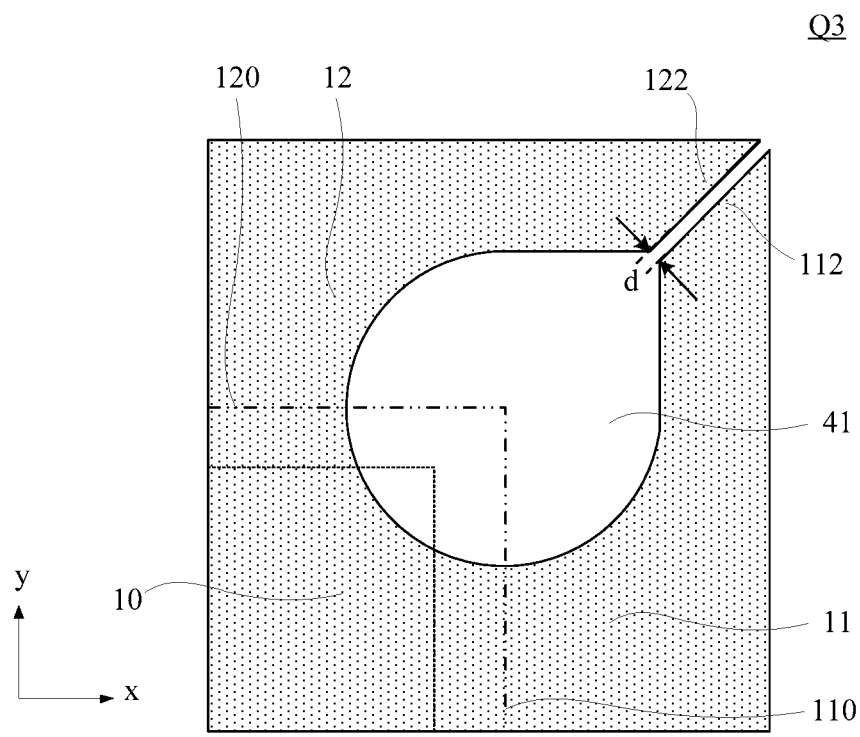
FIG. 14 is an enlarged schematic diagram of an area Q3 shown in FIG. 13.

In an embodiment, FIG. 13 is a schematic diagram of a display panel in an unfolded state, and FIG. 14 is an enlarged schematic diagram of an area Q3 shown in FIG. 13. In the unfolded state, an embodiment of the present disclosure can also design the contour of the first hollow region 41 having an opening. As shown in FIG. 13 and FIG. 14, the contour of the first hollow region 41 can include the opening extending from the first hollow region 41 to an edge of the display panel. Such configuration can increase bending freedom of the first bendable region 11 and the second bendable region 12, to prevent the two from being restrained by each other during the bending process.

Based on the design shown in FIG. 13 and FIG. 14, after bending the first bendable region 11 and the second bendable region 12, a first border 112 of the first bendable region 11 close to the second bendable region 12 can overlap with a second border 122 of the second bendable region 12 close to the first bendable region 11 to form the structure shown in FIG. 3 in such a manner that side surfaces of the display panel formed by the first bendable region 11 and the second bendable region 12 can form a continuous image during display.

As shown in FIG. 14, a distance d between two endpoints of the contour of the first hollow region 41 is smaller than or equal to 0.1 mm. Such setting can, on the basis of ensuring the bending freedom of the display panel, make the first bendable region 11 and the second bendable region 12 capable of contacting or overlapping each other after being bent at a relatively small angle, to ensure the continuity of the side display region of the display panel. It should be noted that when d is designed to be small enough, that is, when d approaches 0, in the unfolded state, the two end points of the first hollow region 41 can contact each other, that is, the contour shape of the first hollow region 41 can also be regarded as a closed shape.

In an embodiment, the above opening can be formed by punching.

It should be understood that FIG. 13 and FIG. 14 are only descriptions by taking the case of designing the contour of the first hollow region 41 as a combination of straight lines and arcs as an example. In an embodiment, the first hollow region 41 also makes it possible to design the whole contour of the first hollow region 41 as arcs or straight lines, that is, when designs of FIG. 1 and FIG. 11 are adopted, an opening in the contour of the first hollow region 41 can also be provided, and its process and working principle are the same as those of the structure shown in FIG. 13, which will not be described herein.

Figure 15:
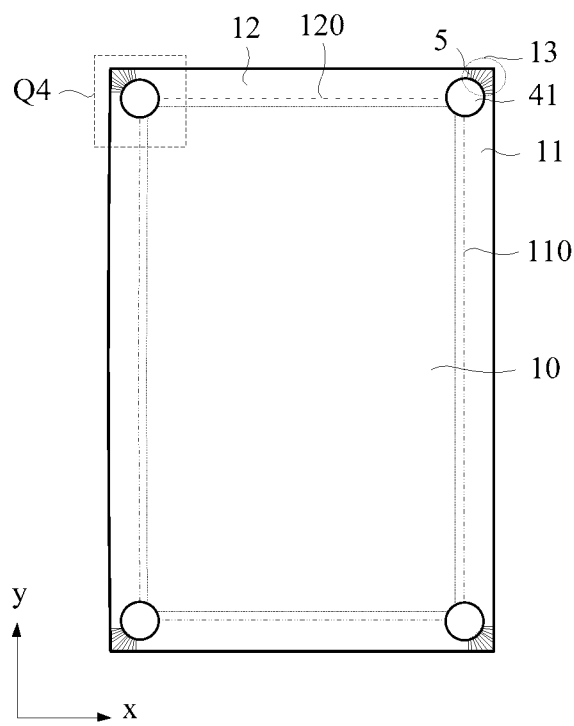
FIG. 15 is a schematic diagram of a display panel in an unfolded state according to an embodiment of the present disclosure.
Figure 16:
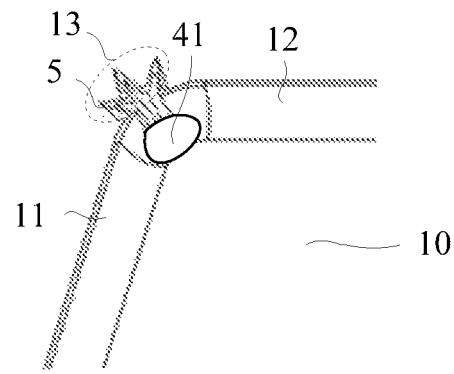
FIG. 16 is an enlarged schematic diagram of Q4 after the display panel shown in FIG. 15 is bent.

In an embodiment, FIG. 15 is a schematic diagram of a display panel in an unfolded state according to an embodiment of the present disclosure, and FIG. 16 is an enlarged schematic diagram of an area Q4 of the display panel shown in FIG. 15 after being bent. The display panel further includes a third bendable region 13. The third bendable region 13 is connected to each one of the first bendable region 11, the second bendable region 12 and the first hollow region 41. The third bendable region 13 at least partially surrounds the first hollow region 41. The base substrate 1 is located in the main display region 1, the first bendable region 11, the second bendable region 12, and the third bendable region 13. In an embodiment of the present disclosure, an elastic modulus of the base substrate 1 located in the third bendable region 13 is smaller than an elastic modulus of the base substrate 1 located in the first bendable region 11 and an elastic modulus of the base substrate 1 located in the second bendable region 12.

When bending the first bendable region 11 and the second bendable region 12, if the display panel is not provided with an opening connecting the first hollow region 41 and the border of the display panel, the bending of the first bendable region 11 and the second bendable region 12 will be restrained by each other. In an embodiment, the third bendable region 13 located between the first bendable region 11 and the second bendable region 12 and used to connect the first bendable region 11 and the second bendable region 12 will be subjected to two stresses from the first bendable region 11 and the second bendable region 12. Since directions of the bending stresses from the first bendable region 11 and the second bendable region 12 are different, if rigidity of the third bendable region 13 is relatively large, the third bendable region 13 becomes prone to twisting and breaking or having other defects. The embodiment of the present disclosure, can make the third bendable region 13 more easily deformed during the bending process by making the elastic modulus of the base substrate 1 in the third bendable region 13 smaller than those of the first bendable region 11 and the second bendable region 12 As a result, the possibility of defects, such as cracks appearing during the bending process, is reduced. Moreover, such configuration, in comparison to the display panel that is not provided with the opening shown in FIG. 14, can also improve the bending freedom of the first bendable region 11 and the second bendable region 12.

In an embodiment, the base substrate 1 located in the third bendable region 13 can be a foldable structure. As shown in FIG. 15 and FIG. 16, the foldable structure includes a plurality of foldable sub-portions 5, and the plurality of foldable sub-portions 5 are arranged along a direction pointing from the first bendable region 11 to the second bendable region 12. In the unfolded state, as shown in FIG. 15, the foldable sub-portion 5 and the base substrate 1 located in the main display region 10 are located in a same plane. In the bent state, as shown in FIG. 16, at least a part of the foldable sub-portions 5 will be deformed and shifted under an action of the first bendable region 11 and/or the second bendable region 12, and the part of the foldable sub-portions 5 will move to a position that is located in a plane different from that of the base substrate 1 located in the main display region 10. During the bending process, the part of the foldable sub-portions 5 will move from a position that is located in the same plane as the base substrate 1 located in the main display region 10 towards a direction facing away from a light-emitting side of the display panel. After bending, as shown in FIG. 16, the part of the foldable sub-portions 5 will move to a backlight side of the display panel, that is, to a side of the display panel facing away from the light-emitting side. When observing a display image, this part of the structure cannot be observed by a user. In an embodiment, by providing a plurality of the foldable sub-portions 5 in the third bendable region 13, can cause the display panel to complete the change from the unfolded state to the bent state through changes of relative positions and shapes of at least a part of the foldable sub-portions 5. When the display panel is in its bent state, a side of the third bendable region 13 facing the light-emitting side can be approximately formed with a smooth curved structure as shown in FIG. 3 by a plurality of closely arranged foldable sub-portions 5.

In an embodiment, the display panel includes a plurality of pixel units, a plurality of pixel circuits electrically connected to the plurality of pixel units, and a plurality of photosensitive switches. The plurality of pixel units and the pixel circuits are located in the main display region 10, the first bendable region 11, the second bendable region 12, and the third bendable region 13. The pixel unit and the pixel circuit can be provided in each of the foldable sub-portions 5 of the third bendable region 13. In an embodiment of the present disclosure, the photosensitive switch can also be provided in the foldable sub-portion 5, and the pixel circuit in the sub-foldable portion 5 is electrically connected to a driving chip through the photosensitive switch. When the foldable sub-portion 5 and the base substrate 1 that is located in the main display region 10 are located in the same plane, the photosensitive switch is switched on, so that the pixel circuit can normally receive signals from the driving chip, in order to make the pixel circuit work normally and to illuminate the corresponding pixel unit. When the foldable sub-portion 5 and the base substrate 1 located in the main display region 10 are located in different planes, for example, when the foldable sub-portion 5 is folded under the effect of the first bendable region 11 and/or the second bendable region 12, the photosensitive switch is switched off, in such a manner that the pixel circuit cannot operate, and the pixel unit located in the part of the foldable sub-portions 5 is not lit.

Figure 17:
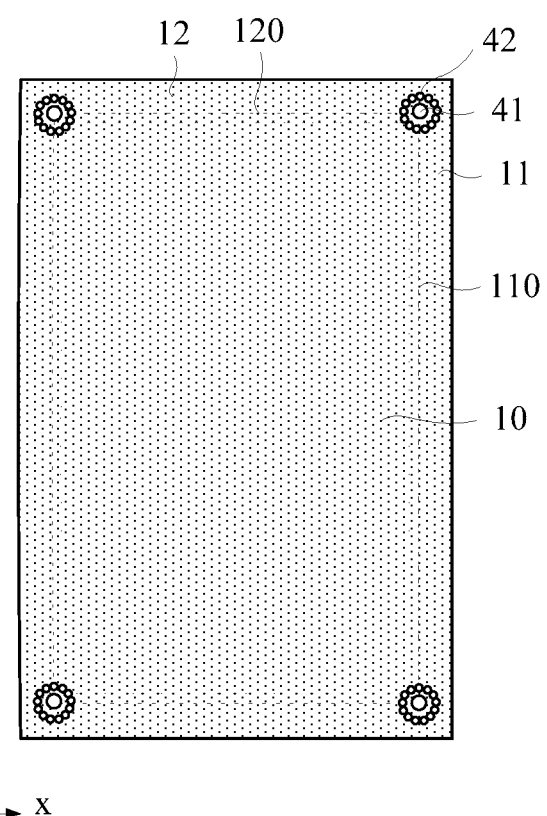
FIG. 17 is a schematic diagram of yet another display panel in an unfolded state according to an embodiment of the present disclosure.

Illustratively, FIG. 17 is a schematic diagram of another display panel in an unfolded state according to an embodiment of the present disclosure, and the display panel provided by an embodiment of the present disclosure further includes a plurality of second hollow regions 42. The plurality of the second hollow regions 42 at least partially surround the first hollow region 41. The bending stress generated during the bending process of the display panel can be released through the plurality of the second hollow regions 42, so that the bending reliability of the display panel can be further improved.

Illustratively, as shown in FIG. 17, the extension line of the first bending axis 110 or the extension line of the second bending axis 120 passes through at least one of the plurality of second hollow regions 42. Since the position where the first bending axis 110 or the second bending axis 120 is located is a position of the display panel where the bending stress is relatively large, the embodiment of the present disclosure, through making the extension line of the first bending axis 110 or the extension line of the second bending axis 120 pass through at least one of the second hollow regions 42, can further release the stress generated in the bending process of the display panel.

In an embodiment, as shown in FIG. 5, in an embodiment of the present disclosure, a first auxiliary display region 14 can be further provided on a side of the first bendable region 11 facing away from the main display region 10, and the first auxiliary display region 14 is provided therein with a driving circuit layer 2 and a display function layer 3. The display panel located in the first auxiliary display region 14 can have better flexibility, or a flexibility of the display panel located in the first auxiliary display region 14 can also be smaller than a flexibility of the display panel located in the first bendable region 11. For example, in the bent display panel, the first auxiliary display region 14 can be a flat surface. The first auxiliary display region 14 can increase the side display region of the display panel. In addition, when an area of the first auxiliary display region 14 is large enough, a partial region in the first auxiliary display region 14 can also be bent to a backside of the display panel opposite to the main display region 10, so that the backside of the display panel can also be used for display.

Similarly, as shown in FIG. 6, in an embodiment of the present disclosure, a second auxiliary display region 15 can also be provided on a side of the second bendable region 12 facing away from the main display region 10, and the second auxiliary display region 15 is provided with a driving circuit layer 2 and a display function layer 3, so that the second display region 15 can also be used for display.

Figure 18:
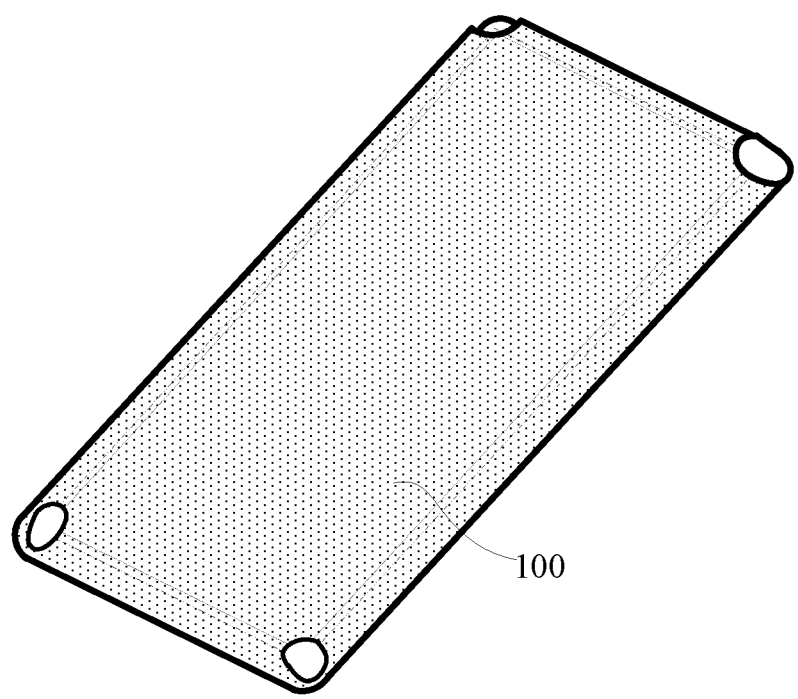
FIG. 18 is a schematic diagram of a display device according to an embodiment of the present disclosure.

An embodiment of the present disclosure further provides a display device, as shown in FIG. 18. FIG. 18 is a schematic diagram of a display device provided by an embodiment of the present disclosure, and the display device includes the above-described display panel 100. A structure of the display panel 100 has been described in detail in the above embodiments and will not be repeated herein. It should be understood that the display device shown in FIG. 18 is only for schematic illustration, and the display device can be any electronic device having a display function, such as a mobile phone, a tablet computer, a notebook computer, an electronic paper book, or a television.

In an embodiment, the present disclosure can further include functional modules such as a camera, an earpiece, a sensing device, and key control provided in the first hollow region of the display panel 100.

The above are only some embodiments of the present disclosure and are not intended to limit the present disclosure. Any modifications, equivalents, improvements, etc., which are made within the spirit and principles of the present disclosure, should be included in the scope of the present disclosure.

What is claimed is:

1. A display panel, comprising:
   a main display region;
   a first bendable region, wherein the first bendable region and the main display region are connected to each other and arranged along a first direction, and wherein the first bendable region is capable of being bent away from a light-exiting surface of the display panel through a first bending axis;
   a second bendable region, wherein the second bendable region and the main display region are connected to each other and arranged along a second direction, wherein the second direction intersects the first direction, and wherein the second bendable region is capable of being bent away from the light-exiting surface of the display panel through a second bending axis;
   a first hollow region, wherein an intersection point of extension lines of the first bending axis and the second bending axis is located in the first hollow region;
   a third bendable region connected to the first bendable region, the second bendable region and the first hollow region,
   wherein the third bendable region at least partially surrounds the first hollow region,
   wherein the display panel comprises a base substrate that is located in the main display region, the first bendable region, the second bendable region and the third bendable region, and
   wherein an elastic modulus of the base substrate located in the third bendable region is smaller than both an elastic modulus of the base substrate located in the first bendable region and an elastic modulus of the base substrate located in the second bendable region.

2. The display panel according to claim 1, wherein at least a part of the first hollow region is located at a side of the first bending axis close to the main display region or a side of the second bending axis close to the main display region.

3. The display panel according to claim 1, wherein in an unfolded state, the first hollow region is L-shaped, wherein an inflection point of the first hollow region covers the intersection point of the extension lines of the first bending axis and the second bending axis.

4. The display panel according to claim 1, wherein the first bendable region comprises a first edge facing away from the main display region and not intersecting with the first bending axis, wherein the second bendable region comprises a second edge facing away from the main display region and not intersecting with the second bending axis, and wherein the first edge and the second edge are connected to each other.

5. The display panel according to claim 1, wherein in a bent state, the first hollow region comprises:
   a first partial region located on a plane of the main display region of the display panel, and
   a second partial region located on a plane of the first bendable region or a plane of the second bendable region.

6. The display panel according to claim 1, further comprising:
   a plurality of second hollow regions surrounding the first hollow region.

7. The display panel according to claim 6, wherein the extension line of the first bending axis or the extension line of the second bending axis passes through at least one of the plurality of second hollow regions.

8. The display panel according to claim 1, wherein the base substrate located in the third bendable region is a foldable structure, wherein the foldable structure comprises a plurality of foldable sub-portions arranged along a direction from the first bendable region to the second bendable region;
   wherein, in an unfolded state, the plurality of foldable sub-portions and the base substrate that is located in the main display region are located in a same plane; and
   wherein, in a bent state, at least one of the plurality of foldable sub-portions is located in a different plane from the base substrate located in the main display region and is located at a side of the display panel facing away from a light-exiting side of the display panel.

9. The display panel according to claim 8, comprising:
   a plurality of pixel units;
   a plurality of pixel circuits electrically connected to the plurality of pixel units, the plurality of pixel units and the plurality of pixel circuits being located in the main display region, the first bendable region, the second bendable region, and the third bendable region; and
   a plurality of photosensitive switches located in the plurality of foldable sub-portions,
   wherein one of the plurality of pixel circuits located in one of the plurality of foldable sub-portions is electrically connected to one of the plurality of photosensitive switches; wherein when the one of plurality of foldable sub-portions and the base substrate that is located in the main display region are located in a same plane, the one of the plurality of photosensitive switches is switched on; and wherein when the one of the plurality of foldable sub-portions is located in a different plane from the base substrate located in the main display region, the one of the plurality of photosensitive switches is switched off.

10. The display panel according to claim 1, wherein in an unfolded state, the first hollow region has a closed contour.

11. The display panel according to claim 1, wherein in an unfolded state, the first hollow region has a contour comprising an arc.

12. The display panel according to claim 11, wherein the arc protrudes away from a center of the first hollow region.

13. The display panel according to claim 11, wherein an orthographic projection of the arc on a plane of the display panel overlaps a part of a border of the main display region.

14. The display panel according to claim 11, wherein the contour of the first hollow region further comprises two line segments, wherein one of endpoints of one of the two line segments is connected to one of endpoints of the other one of the two line segments, and wherein the other endpoint of the one of the two line segments and the other endpoint of the other one of the two line segments are respectively connected to two endpoints of the arc.

15. The display panel according to claim 11, wherein an angle $\theta$ of the arc satisfies: $0°<\theta\leq270°$.

16. The display panel according to claim 1, wherein in an unfolded state, the first hollow region has a contour having an opening.

17. The display panel according to claim 16, wherein a distance between two endpoints of the contour of the first hollow region is less than or equal to 0.1 mm.

18. A display device, comprising a display panel wherein the display panel comprises:
   a main display region;
   a first bendable region, wherein the first bendable region and the main display region are connected to each other and arranged along a first direction, and wherein the first bendable region is capable of being bent away from a light-exiting surface of the display panel through a first bending axis;
   a second bendable region, wherein the second bendable region and the main display region are connected to each other and arranged along a second direction, wherein the second direction intersects the first direction, and wherein the second bendable region is capable of being bent away from the light-exiting surface of the display panel through a second bending axis;
   a first hollow region, wherein an intersection point of extension lines of the first bending axis and the second bending axis is located in the first hollow region;
   a third bendable region connected to the first bendable region, the second bendable region and the first hollow region,
   wherein the third bendable region at least partially surrounds the first hollow region,
   wherein the display panel comprises a base substrate that is located in the main display region, the first bendable region, the second bendable region and the third bendable region, and
   wherein an elastic modulus of the base substrate located in the third bendable region is smaller than both an elastic modulus of the base substrate located in the first bendable region and an elastic modulus of the base substrate located in the second bendable region.

* * * * *